United States Patent

Köhler et al.

[11] Patent Number: 5,219,908
[45] Date of Patent: Jun. 15, 1993

[54] PAS WITH REDUCED FLASH FORMATION AND GOOD MECHANICAL PROPERTIES

[75] Inventors: Burkhard Köhler; Bahman Sarabi; Sabine Dorf; Hans-Detlef Heinz, all of Krefeld; Friedrich Jonas, Aachen, all of Fed. Rep. of Germany

[73] Assignee: Bayer Aktiengesellschaft, Leverkusen-Bayerwerk, Fed. Rep. of Germany

[21] Appl. No.: 836,400

[22] Filed: Feb. 18, 1992

[30] Foreign Application Priority Data

Feb. 27, 1991 [DE] Fed. Rep. of Germany ....... 4106124

[51] Int. Cl.$^5$ .......................... C08K 5/42; C08K 5/41; C08K 5/32
[52] U.S. Cl. .................................... 524/159; 524/171; 524/172; 524/237; 524/260; 524/342; 524/343; 524/609
[58] Field of Search ............... 524/237, 260, 171, 172, 524/159, 342, 343, 609; 525/537

[56] References Cited

U.S. PATENT DOCUMENTS

| | | | |
|---|---|---|---|
| 3,249,582 | 5/1966 | Schmidt et al. | 524/237 |
| 4,208,486 | 6/1980 | Patton | 524/159 |
| 4,239,678 | 12/1980 | Williams | 524/159 |
| 4,952,624 | 8/1990 | Kohler et al. | 524/260 |
| 4,996,256 | 2/1991 | Heinz et al. | 524/260 |
| 5,086,128 | 2/1992 | Heinz et al. | 524/260 |
| 5,093,397 | 3/1992 | Kohler et al. | 524/609 |

FOREIGN PATENT DOCUMENTS

| | | |
|---|---|---|
| 0345550 | 12/1989 | European Pat. Off. |
| 0345551 | 12/1989 | European Pat. Off. |
| 0428020 | 5/1991 | European Pat. Off. |
| 3841022 | 6/1990 | Fed. Rep. of Germany |

Primary Examiner—Veronica P. Hoke
Attorney, Agent, or Firm—Connolly & Hutz

[57] ABSTRACT

This invention relates to polyarylene sulphides (PAS) containing certain nitro compounds with reduced flash formation.

4 Claims, No Drawings

PAS WITH REDUCED FLASH FORMATION AND GOOD MECHANICAL PROPERTIES

This invention relates to polyarylene sulphides (PAS), in particular polyphenylene sulphides (PPS), with reduced flash formation.

Polyarylene sulphides are known e.g. US-A 3 354 129, EP-A 171 021). They are inert, high temperature resistant thermoplasts which are capable of containing a high proportion of fillers, e.g. glass fibres and/or inorganic fillers. The use of these polymers, in particular of polyphenylene sulphide (PPS), is increasing in fields which were hitherto the preserve of duroplasts.

PAS has unsatisfactory mechanical properties for certain applications in the field of injection moulding. Edge fibre elongation and impact strength in particular are insufficient for practical purposes. The formation of flashes in injection moulding is also a problem when processing PPS compounds.

The mechanical properties of PAS may be improved by means of polyisocyanates (e.g. JP-A 01 118-572) but the use of isocyanates is problematic for reasons of safety at work.

One disadvantage of many PPS compounds is that they form flashes, i.e. when processed by injection moulding the polymer melt exudes from gaps in the mould and forms flashes.

It would therefore be desirable to have PAS compounds available which combine good mechanical properties and sufficient fluidity with relative freedom from flash formation.

It has now been found that a reduction in the formation of flashes is obtained with compounds of PAS containing selected nitro compounds and optionally Novolaks. This invention relates to mixtures of A) from 99.8 to 20% by weight of polyarylene sulphides, preferably polyphenylene sulphide,
B) from 0.2 to 10% by weight of m-nitrobenzaldehyde or nitro compounds corresponding to Formulae (I) to (III), $$((NO_2)\text{—phenylene—}CH=N\text{—})_y\text{—}R \quad (I),$$

$$NO_2\text{—phenylene—}SO_2\text{—phenylene—}NO_2 \quad (II),$$

$$NO_2\text{—phenylene—}SO_2\text{—O—}AR\text{—O—}SO_2\text{—phenylene —}NO_2 \quad (III),$$

wherein
R stands for a di- or trivalent aromatic $C_{6-14}$ or hetero(O,N,S)aromatic or aliphatic $C_{2-22}$group,
Ar stands for a $C_{6-18}$-arylene group built up of one or more phenylene groups which may be linked by chemical bonds or by alkylene or alkylidene groups, and
y stands for 2 or 3,
wherein
B) may also consist of a mixture of
C1) from 0.1 to 5% by weight of m-nitrobenzaldehyde or compounds corresponding to Formulae (I) to (II) and
C2) from 0.1 to 5% by weight of a condensate of phenols and keto compounds or a polymer of alkenylphenols and
D) from 0–79.8% by weight of mineral fillers and reinforcing materials.

The mixtures are prepared as melts in an extruder at temperatures of from 300° to 350° C.

Examples of materials according to the invention corresponding to Formula (I) include azomethines obtainable from m-nitrobenzaldehyde and diamines, e.g. methylene dianiline, m-phenylenediamine or hexamethylenediamine, or triamines such as tris-4-aminophenylmethane or melamine.

The compounds corresponding to Formula (I) may be prepared e.g. by the reaction of m-nitrobenzaldehyde with the amine in the presence of an azeotropic former (e.g. Organikum, Edition 11, publishers VEB-Verlag, page 425).

The compounds according to the invention corresponding to Formula (II) are preferably 3,3'- or 4,4'-dinitrodiphenyl-sulphone, some of which are commercially obtainable or may be obtained by the industrial synthesis of the corresponding sulphochlorides.

Compounds corresponding to Formula (III) are prepared from bisphenols such as hydroquinone, resorcinol, dihydroxybiphenyl or bisphenol-A and o-, m- or p-nitrobenzene sulphochloride, preferably in the presence of auxiliary bases.

The substances used as component C2) are condensates of phenols such as phenol, cresol or other alkyl-substituted phenols with aldehydes or ketones such as formaldehyde, furfural, benzaldehyde, acetaldehyde, cyclohexanone or acetone. Examples of such compounds include bisphenol-A, bisphenol-F and bisphenol-Z but the substances preferably used are condensates such as those described e.g. in Houben-Weyl, Methoden der organischen Chemie, Volume E 20Part 3, Georg Thieme Verlag, Stuttgart, New York, 1987, pages 1794–1810, and the literature cited there.

According to the invention, commercial glass fibres are used, preferably sized with polyurethane film formers or epoxy film formers and with amino or epoxy silane bonding agents. They have a diameter of from 1 to 20µm, preferably from 5 to 13µm. Continuous glass fibres may be used in which the length of the fibres in the finished mixture is from 0.05 to 10 mm, preferably from 0.1 to 2 mm. Continuous glass fibres (rovings) may also be used in processes for the production of continuously reinforced unidirectional composites.

The glass fibres may be replaced, in particular in part, by glass beads, e.g. Ballotini glass beads.

Other mineral fillers or additives which may be used include mica, talc, powdered quartz, metal oxides and sulphides, e.g. $TiO_2$, ZnO or ZnS, graphite, carbon black, fibres, e.g. of quartz or carbon, carbonates such as $MgCO_3$or $CaCO_3$and sulphates such as $CaSO_4$or $BaS)_4$.

Pigments, mould release agents, E-waxes, flow improvers, nucleating agents and stabilizers may also be used.

Bismaleimides such as 4,4'-bismaleic-imido-methylene dianiline may be used as organic additives.

The fillers and additives may be used in amounts of from 0 to 300% by weight, based on PAS.

The compounds according to the invention may be worked up by conventional methods to produce moulded parts, semi-finished goods, boards for printed circuits, fibres, films, sections, etc.. It is generally advantageous to use the compounds according to the invention wherever thermo-plastically processible compounds are normally used.

EXAMPLES

1. Preparation of compound

The PPS used had a fusion viscosity of from 45 to 65 Pas (fusion temperature =310° C., shear velocity =$10^3$ 1/s) and was prepared according to EP-A 171 021.

The glass fibres, used in an amount of 40% by weight, were chopped glass fibres sized with epoxy film formers and epoxy silane bonding agents. Compounding of the mixtures according to the invention was carried out in a double extruder ZSK 32 of Werner & Pfleiderer at 340° C. The viscosity of the compounds was determined by capillary viscosimetry at a mass temperature of 320° C. and a shear velocity of 1/1000 s.

Flat rods measuring 80×10×4 mm³ were produced as shown in the enclosed drawing, with the possibility of the formation of flashes at the end of the sample. The mechanical and thermal properties and the flashes were measured on one and the same sample. The flashes were formed in a gap 10 to 40μm in width under a maximum internal pressure of the mould of 800 bar and a mould surface temperature of 140° C. The samples were tested for their flexural strength, edge fibre elongation (DIN 53 452) and impact strength (ISO 180 Method IC). The flashes were assessed optically by means of an image assessment instrument of Zeiss with ingrated microscope over the whole width of the sample of 10 mm with a scanning rate of 10μm. The average length of flashes thus determined was tested on five samples. All percentages given in the following Examples are percentages by weight.

COMPARISON EXAMPLE 1

59.8% by weight of PPS were mixed with 40% by weight of glass fibres and 0.2% by weight of E-wax.

COMPARISON EXAMPLE 2

58.8% by weight of PPS were mixed with 40% by weight of glass fibres, 1% of 4,4'-bis-maleimido-methylene dianiline and 0.2% by weight of E-wax.

E-wax is the usual commercial mould release wax of Hoechst and consists of esters of so-called montanic acids.

EXAMPLE 1

57.8% by weight of PPS were mixed with 40% of glass fibres, 1% by weight of Vulkadur RB(®) (phenol resin, Novolak of phenol and formaldehyde), 1% by weight of m-nitrobenzaldehyde and 0.2% by weight of E-wax.

EXAMPLE 2

58.8% by weight were mixed with 40% by weight of glass fibres, 1% by weight of 3,3'-dinitrodiphenylsulphone and 0.2% by weight of E-wax.

EXAMPLE 3

58.8% by weight of PPS were mixed with 40% by weight of glass fibres, 1% by weight of bisphenol-A-bis-o-nitro-benzene sulphonic acid ester and 0.2% by weight of E-wax.

EXAMPLE 4

57.8% by weight of PPS were mixed with 40% by weight of glass fibres, 2% by weight of 4,4'-bis-m-nitrobenzalamino-methylene diamine and 0.2% by weight of E-wax.

EXAMPLE 5

58.8% by weight of PPS were mixed with 40% by weight of glass fibres, 1% by weight of m-nitrobenzaldehyde and 0.2% by weight of E-wax.

EXAMPLE 6

56.8% by weight of PPS were mixed with 40% by weight of glass fibres, 1% by weight of m-nitrobenzaldehyde, 1% by weight of Lyncure M(®), a polyvinyl phenol of Maruzen, and 0.2% by weight of E-wax.

The results are summarized in the following Table:

| Example | Izod impact strength (kJ/m²) | Viscosity (Pa.s) | Flash*) (μm) |
| --- | --- | --- | --- |
| Comparison 1 | 42 | 200 | 470 |
| Comparison 2 | 44 | 220 | 440 |
| Example 1 | 44 | 190 | 320 |
| Example 2 | 48 | 310 | 210 |
| Example 3 | 46 | 220 | 350 |
| Example 4 | 47 | 190 | 350 |
| Example 5 | 42 | 210 | 280 |
| Example 6 |  | 190 | 330 |

*)maximum internal pressure of mould: 800 mbar
surface temperature of mould: 140° C.
mass temperature: 340° C.
depth of gap: 40 μm The compounds according to the invention combine very good mechanical properties and good to satisfactory flow properties with markedly improved flow properties compared with the state of the art.

We claim:

1. A composition comprising:
   A) from 99.8 to 20% by weight of polyarylene sulphides,
   B) from 0.2 to 10% by weight of a nitro compound corresponding to formulae (I) to (III)

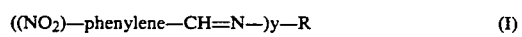
   $$((NO_2)\text{—phenylene—}CH=N\text{—})_y\text{—}R \qquad (I)$$

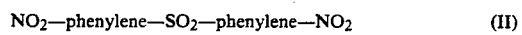
   $$NO_2\text{—phenylene—}SO_2\text{—phenylene—}NO_2 \qquad (II)$$

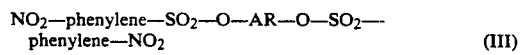
   $$NO_2\text{—phenylene—}SO_2\text{—O—AR—O—}SO_2\text{—phenylene—}NO_2 \qquad (III)$$

wherein
   R stands for a di- or trivalent aromatic $C_{6-14}$ or aliphatic $c_{2-22}$ group,
   Ar stands for a $C_{6-18}$-arylene group comprised of one or more phenylene groups which may be linked by direct bonds or by alkylene or alkylidene groups, and
   Y stands for 2 or 3, and
   from 0–79.8% by weight of mineral fillers and reinforcing materials.

2. The composition of claim 1 additionally containing m-nitrobenzaldehyde or a condensate of phenols and keto compounds or a polymer of alkenylphenols.

3. The composition of claim 1 wherein the polyarylene sulfides are polyphenylene sulfides.

4. The composition of claim 2 wherein the polyarylene sulfides are polyphenylene sulfides.

* * * * *